United States Patent
Boomer et al.

(10) Patent No.: US 8,207,759 B2
(45) Date of Patent: Jun. 26, 2012

(54) MIPI ANALOG SWITCH FOR AUTOMATIC SELECTION OF MULTIPLE INPUTS BASED ON CLOCK VOLTAGES

(75) Inventors: James B. Boomer, Monument, CO (US); Oscar W. Freitas, Cape Elizabeth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 605 days.

(21) Appl. No.: 12/402,794

(22) Filed: Mar. 12, 2009

(65) Prior Publication Data

US 2010/0231285 A1    Sep. 16, 2010

(51) Int. Cl.
*H03K 5/22* (2006.01)
*H03K 5/153* (2006.01)
*H03K 19/23* (2006.01)

(52) U.S. Cl. .................. 327/63; 327/82; 326/35

(58) Field of Classification Search .......... 327/82, 327/63; 370/532, 916; 326/35
See application file for complete search history.

(56) References Cited

U.S. PATENT DOCUMENTS

| | | | | |
|---|---|---|---|---|
| 3,803,425 A * | 4/1974 | Carp | ................. | 327/82 |
| 3,956,591 A * | 5/1976 | Gates, Jr. | .................. | 369/2 |
| 4,347,510 A * | 8/1982 | Ishigaki et al. | ............ | 381/123 |
| 5,223,742 A * | 6/1993 | Schumacher | ................. | 327/31 |
| 5,262,681 A * | 11/1993 | Takeda | .................. | 327/407 |
| 5,272,393 A * | 12/1993 | Horiguchi et al. | ............ | 327/535 |
| 5,306,962 A * | 4/1994 | Lamb | ................. | 327/259 |
| 5,831,464 A * | 11/1998 | Lang | .................. | 327/229 |
| 6,335,641 B1 * | 1/2002 | Tougou | ................. | 327/73 |
| 6,628,146 B2 * | 9/2003 | Tam | ................. | 327/63 |
| 6,693,476 B1 * | 2/2004 | Lin | ................. | 327/203 |
| 6,819,915 B2 * | 11/2004 | Lin | ................. | 455/403 |
| 6,922,091 B2 * | 7/2005 | Kizer | ................. | 327/156 |
| 6,975,145 B1 * | 12/2005 | Vadi et al. | ................. | 327/99 |
| 6,980,789 B2 * | 12/2005 | Lin | ................. | 455/403 |
| 7,532,648 B2 * | 5/2009 | Sweet | ................. | 370/532 |
| 7,548,127 B2 * | 6/2009 | Morini et al. | ................. | 331/57 |
| 7,840,819 B2 * | 11/2010 | Chang et al. | ................. | 713/300 |
| 7,894,491 B2 * | 2/2011 | Batty et al. | ................. | 370/537 |
| 7,969,196 B2 * | 6/2011 | Bennett et al. | ................. | 326/83 |
| 2003/0052806 A1 * | 3/2003 | Hochschild | ................. | 341/143 |
| 2003/0141911 A1 * | 7/2003 | Steiss et al. | ................. | 327/202 |
| 2006/0132190 A1 * | 6/2006 | Driediger et al. | ................. | 327/47 |
| 2007/0080735 A1 * | 4/2007 | Uladzimir | ................. | 327/261 |
| 2008/0048729 A1 * | 2/2008 | Ehrenreich | ................. | 327/63 |
| 2008/0309375 A1 * | 12/2008 | Schnarr | ................. | 327/2 |
| 2009/0049206 A1 * | 2/2009 | Olschner et al. | ................. | 710/14 |
| 2011/0164663 A1 * | 7/2011 | Safiri | ................. | 375/219 |

* cited by examiner

*Primary Examiner* — Lin Ye
*Assistant Examiner* — Chia-Wei A Chen
(74) *Attorney, Agent, or Firm* — Schwegman, Lundberg & Woessner, P.A.

(57) ABSTRACT

An MIPI interface is connected to two sensor sources that each may be transferring both high and low speed information, typically video information in the high speed state. The clock signals are monitored and when one of the clock signals exceed a threshold, an analog switch between the MIPI interface and the sensors, may connect the other source to the MIPI interface.

12 Claims, 4 Drawing Sheets

CLOCK LANE FLOW CHART

MIPI ANALOG SWITCH FOR AUTOMATIC SELECTION OF MULTIPLE INPUTS BASED ON CLOCK VOLTAGES

BACKGROUND OF THE INVENTION

1. Field of the Invention

The present invention relates to sending data from two or more sources to an MIPI (Mobile Industry Processor Interface) receiver and, more particularly, to efficiently switching among the sources.

2. Background Information

Mobile phones are constrained in how many signal lines can be sent between sections of flip, clam shell and slide phones. MIPI interfaces have minimized the signal lines by serializing the transmitted data commonly found in such phones. An MIPI interface, see below, typically has a single clock "lane," CLK, and two data "lanes," D1 and D2, that carry serial data. These three lanes carry signals on pairs of wires, the signals often being differential. Since the MIPI is a point-to-point interface, however, a separate GPIO (general purpose I/O) signal is employed with an analog switch if two sources are sending data to an MIPI interface.

"Coupled," and "connected" are used interchangeably herein and may include other relatively passive components that do not substantially alter the functions being described.

FIG. 1 illustrates a processor 8, with a single camera MIPI interface 2 communicating with two image sensors 4 and 6 via an analog switch 10. Here item 4 is a mega-pixel snapshot image sensor and item 6 is a low resolution video image sensor. The MIPI interface 2 is shown within an application processor 8, but it may be shown as a stand alone controller. The application processor also controls a GPIO, a General Purpose Input-Output interface 12. The GPIO 12 provides the SEL signal that selects which of the two sensors comes through the analog switch 10.

Some issues with the prior art include the use of an additional GPIO interface that must be separately addressed by the processor 8.

The MIPI specification is known to those skilled in the art. That specification is briefly described below to provide an environment framework for the present invention. More detailed information can be obtained by referring to the specification itself.

An MIPI interface has a high speed (HS) operation where D1 and D2 data lanes operate as a differential pair of wires to indicate a logic 1 or 0. An MIPI interface also has a Low Power (LP) and a ULP (Ultra Low Power) state or mode of operation, where each of the two wires, referenced as Dp and Dn, in the data and the clock lanes are driven independently. So in LP or ULP operation there are four possible states of the Dp and Dn wires: 11, 10, 01, and 00. Note in this notation, the values of each Dp and Dn occur at the same time In HS operation, if both the Dp and Dn signals of a data or a clock lane are driven high, for a minimum required time, that lane drives the MIPI into a STOP or CONTROL state.

When in the STOP state the sequence of data on the Dp, Dn wires may define a request to enter into other states. For example a data lane sequence of LP-11>10>00>01>00 will enter the ESCAPE STATE. Once in the ESCAPE mode, an eight bit command may be sent via "Spaced-One-Hot" coding. This coding means that sending a logic 1, termed Mark-1 or a logic 0, termed a Mark-0, is interleaved with a Space state (a zero), where each of the Mark's and Space consists of two parts. That is a Mark-1 is defined as a LP-10 (Dp=1, Dn=0), and a Mark-0 is a LP-01 and a Space is a LP-00. For example, sending a "one" via a LP MIPI interface in the ESCAPE mode would be the following sequence: LP-10>00; and sending a "zero" sequence would be LP-01>00.

In addition a clock lane may enter a STOP mode by driving both Dp and Dn of the clock lane high. From the STOP state the clock may enter the ULPS state by LP-01 or the HS state by LP-10, as discussed below.

SUMMARY OF THE INVENTION

The present invention addresses some of the issues of the prior art by interfacing two or more sources to a receiving MIPI interface without an external GPIO or other such interface two select between or among the sources. The present invention recognizes that the clock signals as defined in the MIPI specification may be used to control the selection, illustratively, between two sources.

The present invention provides selecting and connecting one of two sources to an MIPI interface without using a GPIO or other external interface module. Moreover, the selection of which source is connected to the MIPI receiver may be accomplished by decoding only clock signals Illustratively, when an MIPI source, that is a source meant to be connected to an MIPI interface, changes from a high speed state to a low speed state or vice versa, the system must first go into the STOP state, LP-11. In order to accomplish this, the clock signals exhibit a larger voltage swing. That larger voltage swing may be detected and used to select which of two sources should be connected to the MIPI interface.

Illustratively, when the STOP state is entered both of the differential clock signals of each of CLKA and CLKB go high, and, in one embodiment, both are monitored. But in other embodiments, only one of the differential clock signals of CLKA and CLKB may be monitored. The monitor/detector may be a simple logic gate, but a more accurately thresholded comparator may be used.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
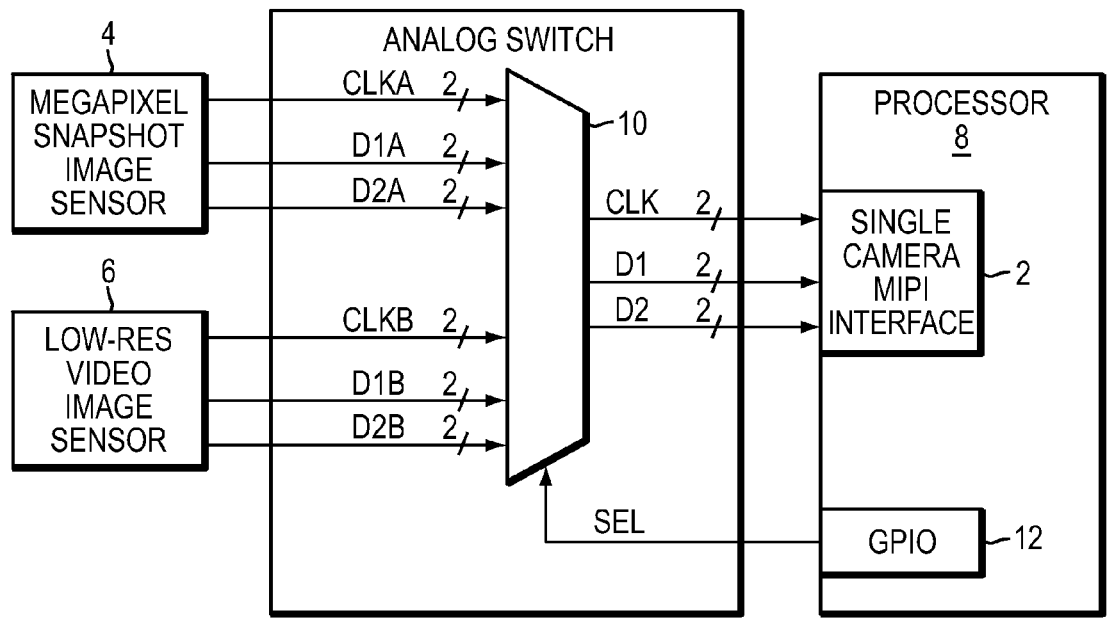
FIG. 1 is a schematic/block diagram of a prior art MIPI interface.
Figure 2:
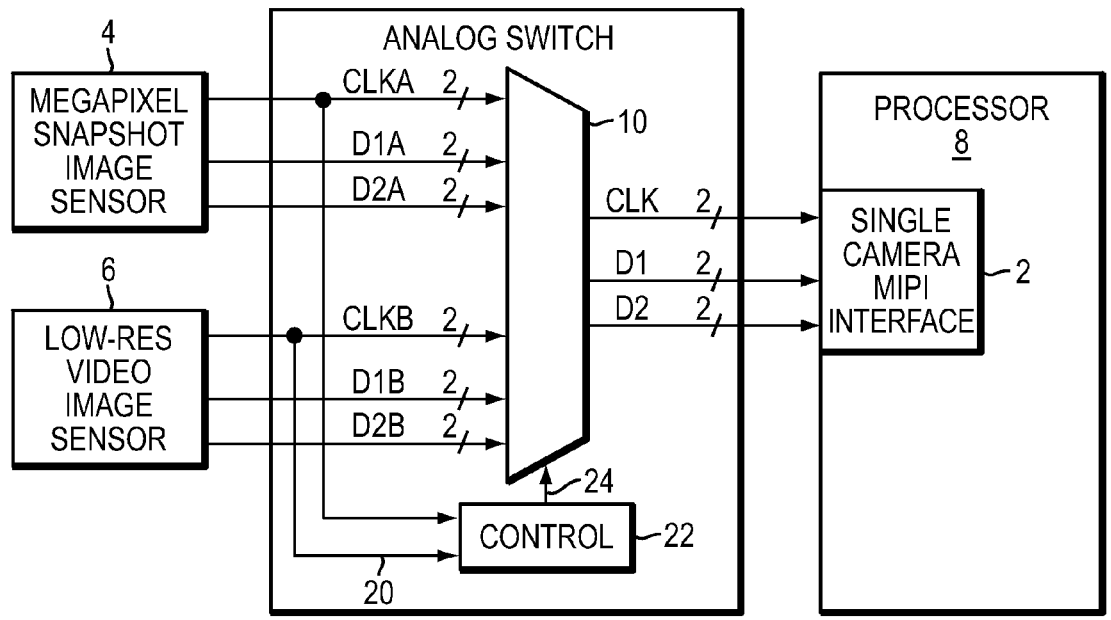
FIG. 2 is a schematic/block diagram embodiment of the present invention.

FIG. 2 differs from FIG. 1 only in the elimination of the GPIO 12 and the addition the CONTROL 22. The CLKA and the CLKB both connect to the CONTROL 22. The CON- TROL outputs a signal 24 that turns on one of the two paths through the analog switch 10 that connects either item 4 or 6 to the MIPI interface 2.

Figure 3:
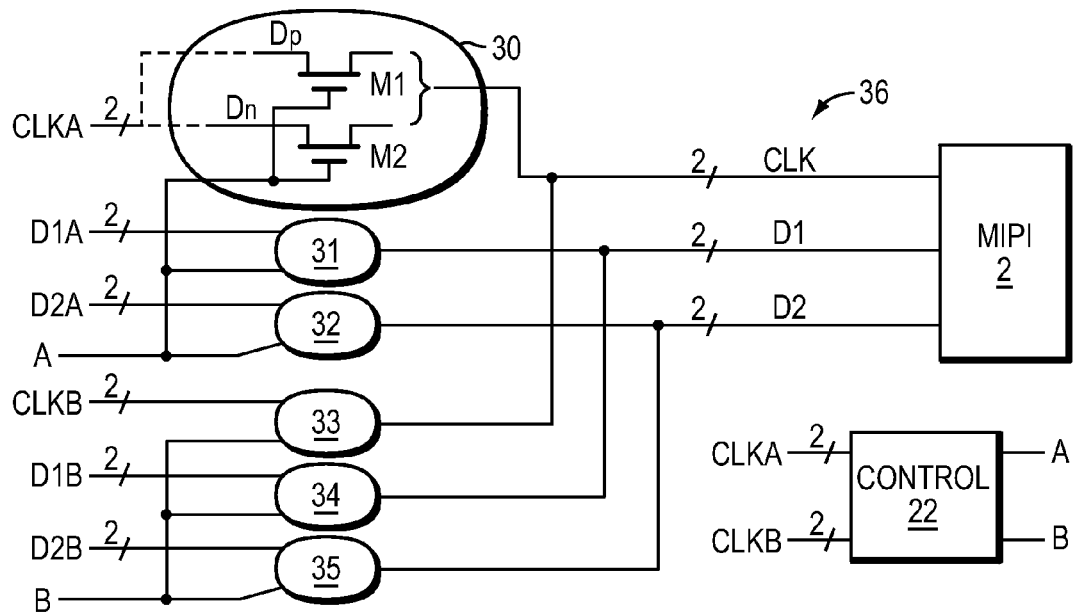
FIG. 3 is an illustration of an analog switch.

FIG. 3 represents the switch 10. Each item 30, 31, 32, 33, 34 and 35 comprises two, preferably MOSFET switches M1, M2 as illustrated for item 30, that carry each of the two indicated signals of each lane through to the MIPI interface 2. The CONTROL 22 output A, when true, turns on the switches 30, 31 and 32 allowing the signal pairs: CLKA, D1A, and D2A to appear at the output 36. The inverse (of A) signal B turns on switches 33, 34, and 35 allowing CLKB, D1B, and D2B to appear at the output 36.

Figure 4:
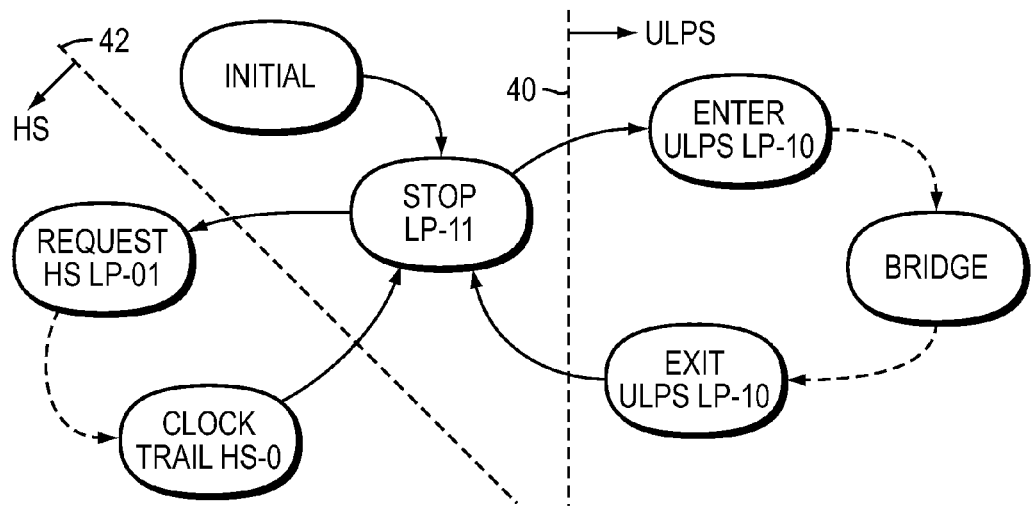
FIG. 4 is a flow chart illustrating states of a clock lane.

FIG. 4 illustrates a clock lane flow chart. Note that from the STOP LP-11 state the system crosses the dotted line 40 to enter the ULPS (Ultra Low Power State) by having an LP-10 input, and the system must return to the STOP LP-11 state before it can cross the dotted line 42 to enter the REQUEST HS LP-10 (High Speed) state.

During HS operation, the clock lane exhibits a low voltage differential swing used to clock in data from the data lanes. As noted above, a HS and the ULPS states will always begin and end in a STOP LP-11 state When in a HS state, the system will only allow entry into the STOP state when there are no HS transmissions on any data lane.

Figure 5:
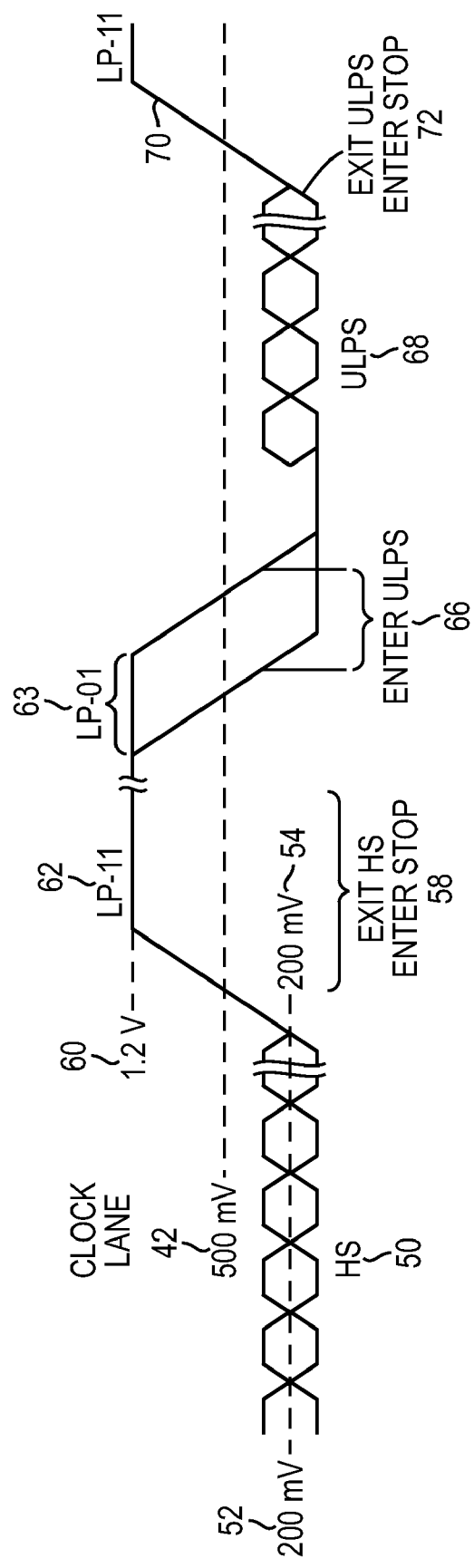
FIG. 5 is a representative timing diagram of MIPI clock signals.

FIG. 5 illustrates a timing sequence of a clock lane. In a HS state 50 the clock lane illustrates a differential signal 52 of about 200 mV at a common mode level 54 of about 200 mV. When both clock signal lines go high 60 to about 1.2V, the STOP LP-11 state 62 is entered. From this STOP state, when LP-01 63 occurs the system enters 66 the ULPS state 68. Later the clock signal may both go high to the 1.2V level 70 returning the system to the STOP state 70.

Still referring to FIG. 5, a 500 mV level 42 may serve as a voltage level that the clock signal only exceeds when exiting the HS or the ULPS states to enter the STOP state LP-11. Both the Dp and Dn signals on the clock lane pair go high at 58 and 70, although only the Dp or the Dn signal might be monitored to detect this entering of the STOP state.

Figure 6:
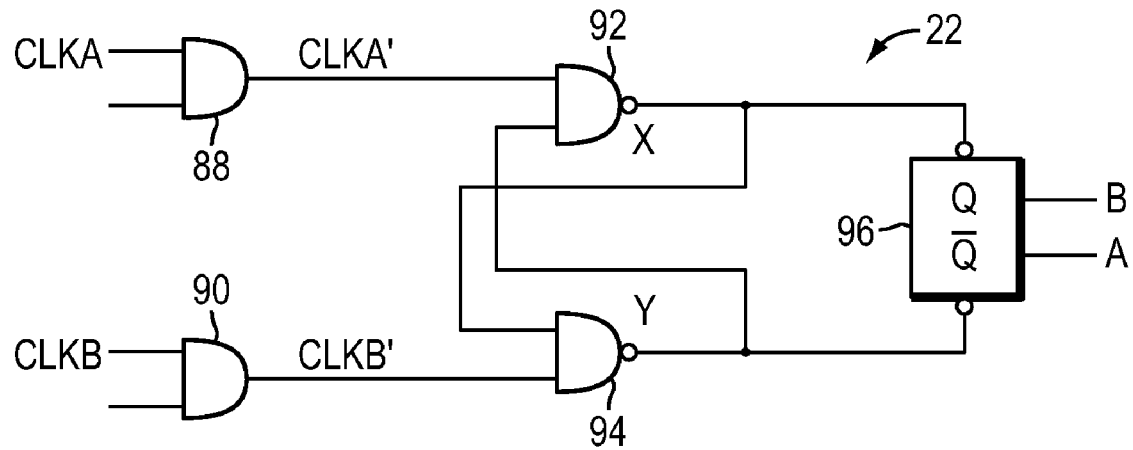
FIG. 6 is a logic table illustrating the logic states from the controller.

FIG. 6 illustrates one logic approach that may be employed that demonstrates the present invention. The approaches are logic gates, or comparators, with thresholds in the 500 mV range. When a high clock signal level exceeds the threshold, a logic signal is generated that will connect one of two sensors items 4 and 6 (FIG. 2) to the MIPI interface 2 (FIG. 2).

In FIG. 6 both differential signals (Dp, Dn) of CLKA are input to a AND gate 88 that outputs CLKA', and both differential signals of CLKB are input to AND gate 90 that outputs CLKB'. Note although both Dp and Dn signals of CLKA and CLKB are being used here, as mentioned above, in other applications only one signal from each clock lane may be used. Moreover, the AND gates 88 and 90 could be OR gates but still arranged with high (500 mV) thresholds.

Figure 7:
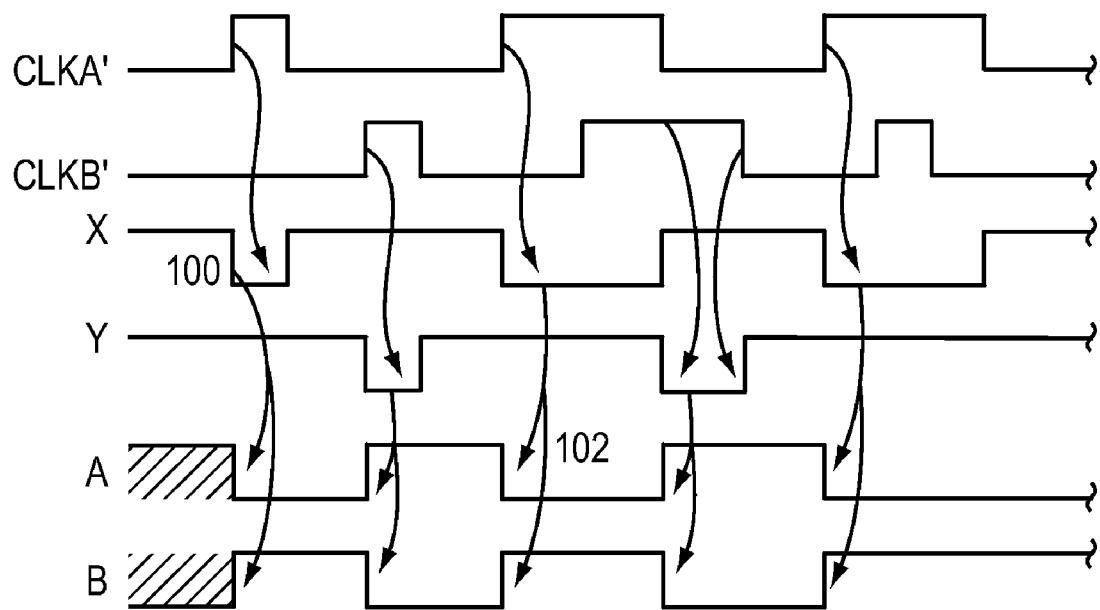
FIG. 7 is a timing chart for the circuit of FIG. 6.

Referencing FIGS. 6 and 7, if Y is high, when CLKA' goes high it drives the X output low 100. The X output connects to the low true set input of the latch 96. Similarly if the Y signal is high, when CLKB' goes high it drives the X output low 102. The Y output connects to the low true reset input of the latch 96. The NANDs 92 and 94 are cross coupled forming a set reset latch.

The Q output of the latch 96 is the A signal from FIG. 3 that connects the CLKA and the A data lanes to the MIPI interface 2, and the B signal connects the CLKB and B data lanes to the MIPI interface 2. A and B will be logic inverses of each other.

Note that since both the CLKA and CLKB could be high at the same time, both in the STOP state, the latch 96 will remain in the state determined by the last low signal on either X or Y.

In the case of FIG. 7, X goes low and sets the latch 96 keeping B high and A low 102, and this state is maintained to the end of the timing chart.

Other logic circuits (not shown), including clocked logic may be employed replacing FIG. 6 that will accomplish the same result, but with more timing preciseness.

Note that the gates 88 and 90 of FIG. 6 may be replaced by comparators that compare a reference voltage to one of the Dp or Dn clock lane signals. The comparator and reference voltage will more accurately determine the thresholds.

The result is that when a Dp or Dn (or both) CLKA signal goes high, sensor B may be connected to the MIPI interface, and when a Dp or Dn (or both) CLKB goes high, sensor A may be connected to the MIPI interface.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. Apparatus connecting two MIPI signal sources, each defining MIPI conforming clock and data lanes to an MIPI interface, the apparatus comprising:
   an analog switch with two inputs, one connected to each of the two MIPI signal sources, one output connecting to the MIPI interface, and a control signal that defines the state of the analog switch;
   a controller comprising a first gate having a first gate output with at least one input connected to at least one of the clock lane signals from one signal source, and a second gate having a second gate output with at least one input connected to at least one of the clock lane signals from the other signal source; wherein each gate defines a threshold, wherein the first and the second gates respond when their thresholds are exceeded;
   the controller further comprising a latch comprising one input connected to the first gate output, and a second input connected to the second gate output, wherein the latch outputs the control signal to the analog switch.

2. The apparatus of claim 1 wherein the controller first and second gates are two input AND gates, wherein the first AND gate inputs are connected to the Dp and Dn clock signals of one signal source and the second AND gate inputs are connected to the Dp and Dn signals from the other signal source.

3. The apparatus of claim 1 wherein the a latch retains the last state of the analog switch.

4. The apparatus of claim 1 wherein the controller employs the logic function, that when the analog switch state connects a first MIPI source to the MIPI interface, when the clock lane for that first source exceeds the gate threshold, the controller changes the state of the analog switch such that the second MIPI source connects to the MIPI interface.

5. The apparatus of claim 1 wherein the first and second gates thresholds are 500 MV.

6. The apparatus of claim 5 wherein the thresholds are 200 MV.

7. A method for connecting two MIPI signal sources, each defining MIPI conforming clock and data lanes to an MIPI interface, the method comprising the steps of:
   comparing the clock lane signals from the two MIPI signal sources to a threshold; and if the threshold is exceeded by at least one of the clock lane signals from one MIPI source,
   connecting the clock lane and data lane signals from the other MIPI signal source to an MIPI interface.

8. The method of claim 7 wherein the threshold is exceed by both of the clock lane signal from one of the MIPI signal sources.

9. The method of claim 7 further comprising the step of latching last state of the analog switch.

10. The method of claim 7 further comprising the steps of: when the analog switch state connects the first MIPI source to the MIPI interface,
   detecting when the clock lane for that first source exceeds the gate threshold, and
connecting the second MIPI source connects to the MIPI interface.

11. The method of claim 7 wherein the first and second gates thresholds are 500 MV.

12. The method of claim 11 wherein the thresholds are 200 MV.

* * * * *